United States Patent
Gokon

(10) Patent No.: US 10,134,578 B2
(45) Date of Patent: Nov. 20, 2018

(54) HOUSING AND SUBSTRATE PROCESSING APPARATUS INCLUDING THE SAME

(71) Applicant: TOKYO ELECTRON LIMITED, Tokyo (JP)

(72) Inventor: Kiyohiko Gokon, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1127 days.

(21) Appl. No.: 13/903,331

(22) Filed: May 28, 2013

(65) Prior Publication Data

US 2013/0319332 A1   Dec. 5, 2013

(30) Foreign Application Priority Data

May 30, 2012 (JP) .................................. 2012-123701
Mar. 13, 2013 (JP) .................................. 2013-50434

(51) Int. Cl.
  *H01L 21/67* (2006.01)
  *H01L 21/02* (2006.01)

(52) U.S. Cl.
  CPC .. *H01L 21/02104* (2013.01); *H01L 21/67017* (2013.01); *H01L 21/6719* (2013.01)

(58) Field of Classification Search
  CPC .... H01L 21/6719; H01L 21/67373–21/67376; H01L 21/67201; H01L 21/67775; H01L 21/67389; H01L 21/67393
  USPC ......................... 156/345.31–345.32; 118/719
  See application file for complete search history.

(56) References Cited

U.S. PATENT DOCUMENTS

| | | | | |
|---|---|---|---|---|
| 5,221,201 A | * | 6/1993 | Yamaga | C30B 31/103 414/937 |
| 5,536,320 A | * | 7/1996 | Ushikawa | C23C 16/4401 118/715 |
| 5,551,984 A | * | 9/1996 | Tanahashi | C23C 16/4401 118/715 |
| 6,186,331 B1 | * | 2/2001 | Kinpara | H01L 21/67373 206/454 |
| 2005/0016454 A1 | * | 1/2005 | Kurita | B65G 49/068 118/719 |
| 2005/0095826 A1 | * | 5/2005 | Fujita | C23C 16/4401 438/540 |

(Continued)

FOREIGN PATENT DOCUMENTS

JP   H06-224145 A    8/1994
JP   3176160 B2      4/2001

(Continued)

*Primary Examiner* — Gordon Baldwin
*Assistant Examiner* — Charlee J C Bennett
(74) *Attorney, Agent, or Firm* — Nath, Goldberg & Meyer; Jerald L. Meyer

(57) ABSTRACT

According to an embodiment of the present disclosure, a substrate processing apparatus including a housing is provided. The housing having an internal atmosphere of a reduced oxygen concentration includes a box structure configured to accommodate a substrate holder which receives a plurality of substrates therein and including a first gap and a second gap. Further, the housing includes an inert gas pipe connected to the box structure, and configured to supply an inert gas to the box structure, a cover member mounted in the box structure, and a buffer space formed between an internal space of the box structure and the cover member.

7 Claims, 11 Drawing Sheets

(56) References Cited

U.S. PATENT DOCUMENTS

| | | | | |
|---|---|---|---|---|
| 2011/0210042 A1* | 9/2011 | Okabe | ............... | H01L 21/67376 |
| | | | | 206/710 |
| 2011/0240601 A1* | 10/2011 | Hashizume | ....... | H01L 21/02063 |
| | | | | 216/83 |
| 2011/0305543 A1* | 12/2011 | Nakashima | ....... | H01L 21/67017 |
| | | | | 414/217.1 |
| 2012/0240858 A1* | 9/2012 | Taniyama | ......... | H01L 21/67017 |
| | | | | 118/726 |

FOREIGN PATENT DOCUMENTS

| | | | |
|---|---|---|---|
| JP | 2002-299272 A | 10/2002 |
| JP | 2009-206156 A | 9/2009 |
| KR | 10-2008-0022518 A | 3/2008 |

* cited by examiner

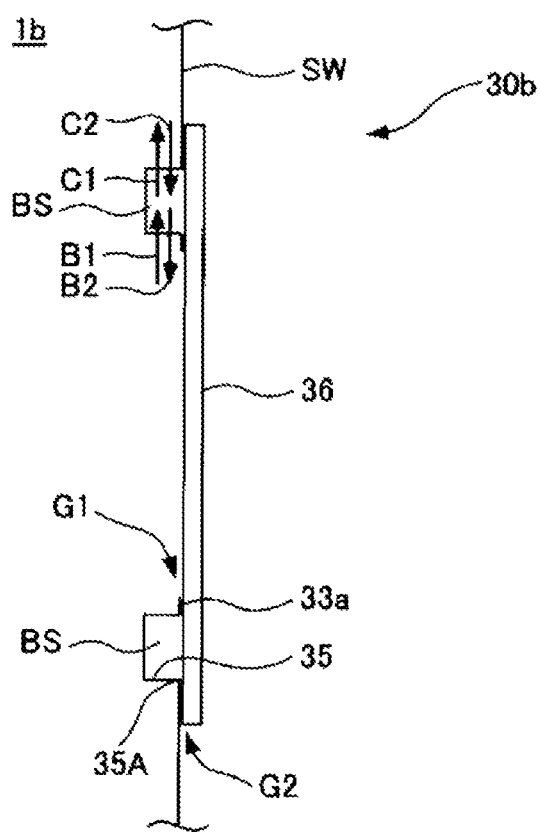

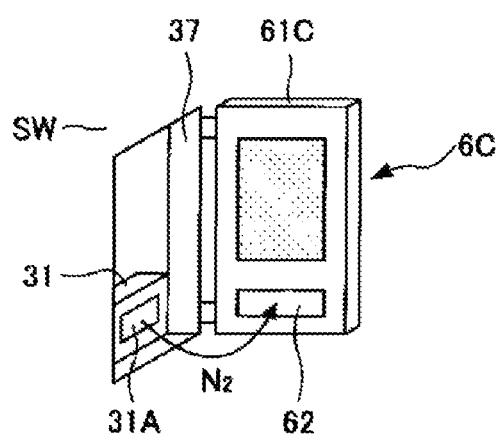

FIG. 10

| | | oxygen concentration | |
|---|---|---|---|
| | | internal space | buffer space |
| Condition 1 | one-sided adhesive tape (sealing gap by adhesive tape) | 4.0ppm | 13.0% |
| Condition 2 | one-sided adhesive tape (sealing gap by adhesive tape) | 3.9ppm | 13.5% |
| Condition 3 | one-sided adhesive tape (sealing gap by sealing member) | 3.2ppm | 600ppm |
| Condition 4 | one-sided adhesive tape (sealing gap by sealing member) | 3.2ppm | 460ppm |
| Condition 5 | two-sided adhesive tape (sealing gap by sealing member) | 3.2ppm | 520ppm |
| Condition 6 | two-sided adhesive tape (sealing gap by sealing member and also one-sided adhesive tape) | 3.2ppm | 333ppm |
| comparative example | none of cover member | 5.0ppm | — |

HOUSING AND SUBSTRATE PROCESSING APPARATUS INCLUDING THE SAME

CROSS-REFERENCE TO RELATED APPLICATIONS

This application claims the benefit of Japanese Patent Application Nos. 2012-123701 and 2013-050434, filed on May 30, 2012 and Mar. 13, 2013, in the Japan Patent Office, the disclosure of which is incorporated herein in its entirety by reference.

TECHNICAL FIELD

The present disclosure relates to a housing having an internal atmosphere of a reduced oxygen concentration, which is capable of preventing oxidation of a surface of a substrate, and a substrate processing apparatus including the same.

BACKGROUND

In manufacturing a semiconductor integrated circuit, there is a process of forming a titanium nitride (TiN) film as a metal barrier layer, or forming a titanium silicide ($TiSi_x$) film as an intermediate protection layer underlying the TiN film. The TiN film and the $TiSi_x$ film are formed by heating a titanium (Ti) film formed on a semiconductor wafer (hereinafter, referred simply to as a "wafer") inside, e.g., a vertical heating furnace of a heat treating apparatus and simultaneously, exposing the same to ammonia ($NH_3$) and disilane ($Si_2H_6$).

The wafer on which the TiN film is formed, is stored and transferred in an atmosphere of a sufficiently reduced oxygen concentration using an internally-sealed wafer carrier such as a Front Opening Unified Pod (FOUP). With this configuration, the wafer can be transferred up to a heating unit without oxidizing the Ti film.

However, in a loading region defined below the heating furnace inside the heating unit, the wafer is exposed to an atmospheric atmosphere, which oxidizes the TiN film. This increases a resistivity of the TiN film or the $TiSi_x$ film, which is formed by exposing the Ti film to the $NH_3$ gas or the $Si_2H_6$ gas.

For this reason, an inert gas is supplied to the loading region to form an atmosphere of a reduced oxygen concentration and to prevent the surface of the Ti film from being oxidized. Specifically, sealability of a box structure having a box shape which constitutes the loading region is increased, and the inert gas is supplied to keep an internal space of the box structure in a positive pressure. This prevents the outside air from being introduced into the internal space of the box structure. In addition, the internal space is purged by the supplied inert gas so that the oxygen concentration in the internal space is reduced.

In order to efficiently prevent the oxidization of the surface of the Ti film, there is a need to supply a mass of inert gases to the box structure so as to reduce the oxygen concentration in the loading region as much as possible. Unfortunately, the supply of the mass of the inert gas increases manufacturing costs of an integrated circuit (IC). To overcome this problem, there is a need to further increase the sealability of the box structure to thereby reduce the supply amount of the inert gas.

However, in a case where the internal space of the box structure is kept in the positive pressure by the inert gas, it has proved that, although few outside air is directly introduced into the internal space of the box structure, when a small amount of the inert gas is leaked from the box structure to the outside, the outside air is reversely diffused to the internal space. This makes it difficult to realize a reduced oxygen concentration, e.g., 10 ppm or less, which is required to prevent the oxidization of the Ti film, in the internal space of the box structure.

SUMMARY

Some embodiments of the present disclosure provide to a housing of a substrate processing apparatus, which is capable of reducing an oxygen concentration in an internal space thereof.

According to a first aspect of the present disclosure, a housing having an internal atmosphere of a reduced oxygen concentration is provided. The housing includes a box structure configured to accommodate a substrate holder which receives a plurality of substrates therein and including a first gap and a second gap, and an inert gas pipe connected to the box structure, and configured to supply an inert gas to the box structure. Further, the housing includes a cover member mounted in the box structure, and a buffer space formed between an internal space of the box structure and the cover member. Gas in the internal space is leaked through the first gap to the buffer space and the gas in the buffer space is leaked to the outside through the second gap, and the internal space is kept in a positive pressure by the inert gas supplied thereto through the inert gas pipe.

According to a second aspect of the present disclosure, a housing having an internal atmosphere of a reduced oxygen concentration is provided. The housing includes a box structure configured to accommodate a substrate holder which receives a plurality of substrates therein and including an opening section formed in a side wall, and an inert gas pipe connected to a box structure, and configured to supply an inert gas to the box structure. The housing further includes a mounting surface formed by bending an end portion of the opening section toward the center of the opening section by a predetermined number, starting at a bend starting point on the side wall, the mounting surface being formed parallel to the side wall, and a cover member configured to bring into contact with the mounting surface and the bend starting point to cover the opening section while maintaining a predetermined gas-tightness allowing gas in the internal space to flow through the contact portions; and a buffer space formed between the mounting surface and the bend starting point and the cover member. The gas in the internal space and the buffer space is leaked through the contact portions, and the internal space of the box structure is kept in a positive pressure by the inert gas supplied thereto through the inert gas pipe.

According to a third aspect of the present disclosure, a housing having an internal atmosphere of a reduced oxygen concentration is provided. The housing includes a box structure configured to accommodate a substrate holding unit which receives a plurality of substrates therein and including an opening section formed in a side wall, and an inert gas pipe connected to a box structure, and configured to supply an inert gas to the box structure. Further, the housing includes a plurality of mounting surfaces formed by bending an end portion of the opening section toward the center of the opening section by a predetermined number, starting at a bend starting point on the side wall, the mounting surfaces being formed parallel to the side wall and at an inner position than the side wall, and a cover member configured to bring into contact with the plurality of mounting surfaces to cover the opening section while maintaining a predetermined gas-tightness allowing gas in the internal space to flow through the contact portions. Also, the housing includes a buffer space formed between the plurality of mounting surfaces and the cover member. The gas in the internal space and the buffer space is leaked through the contact portions, and an internal space of the box structure is kept in a positive pressure by the inert gas supplied thereto through the inert gas pipe.

According to a fourth aspect of the present disclosure, a substrate processing apparatus having an internal atmosphere of a reduced oxygen concentration is provided. The substrate processing apparatus includes a housing of the third aspect of the present disclosure, a reaction tube configured to receive a substrate holder, and a process gas supply unit configured to supply a predetermined process gas into the reaction tube.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a view showing a housing according to a third embodiment of the present disclosure.

FIGS. 7A and 7B are views showing a housing according to a fourth embodiment of the present disclosure.

FIG. 10 is another graph showing the variation of oxygen concentration with respect to time in an internal space of a box structure and a buffer space.

DETAILED DESCRIPTION

Figure 1:
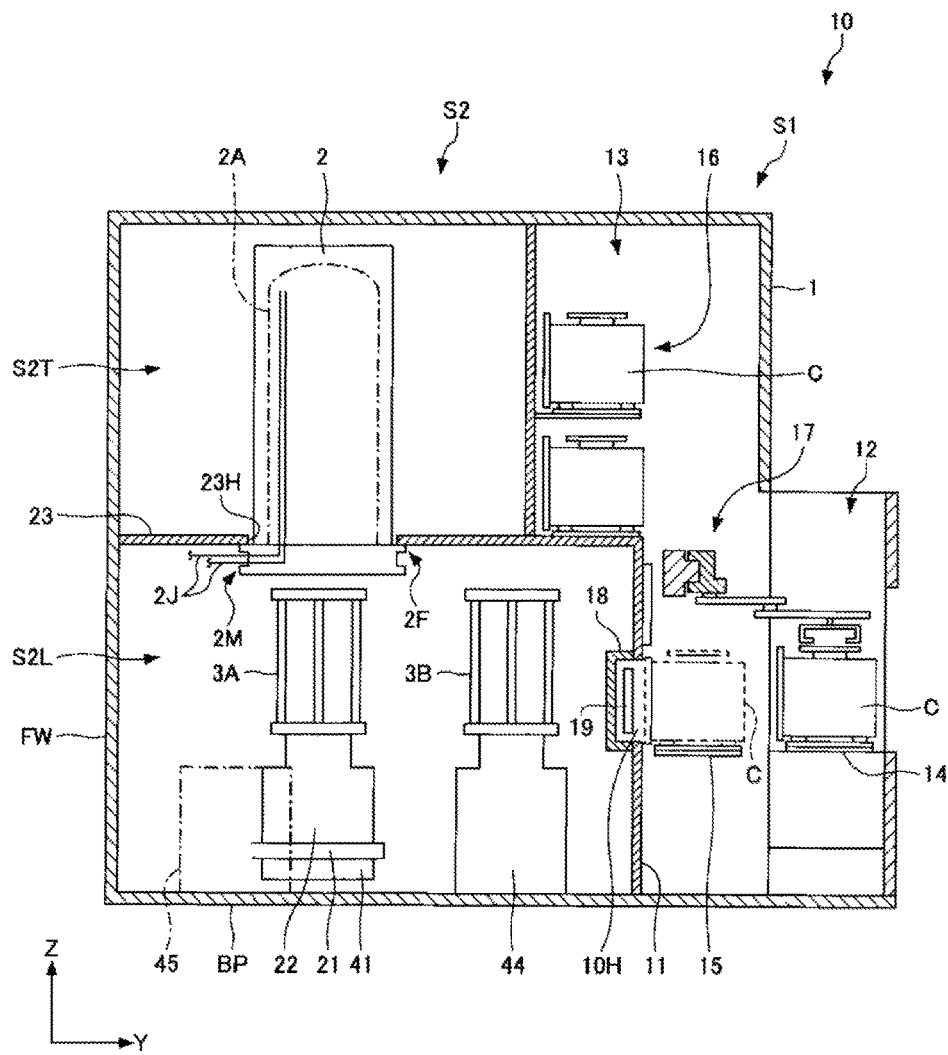
FIG. 1 is a schematic vertical sectional view showing an internal configuration of a film forming apparatus according to a first embodiment of the present disclosure.

Hereinafter, non-limitative exemplary embodiments of the present disclosure will be described in detail with reference to the accompanying drawings. Like reference numerals in the drawings denote like elements, and a duplicate description thereof will be omitted. Also, in the drawings, the sizes of elements and the relative sizes between elements are exaggerated for clarity of illustration. Therefore, the thicknesses and dimensions of elements should be determined in consideration of the non-limitative exemplary embodiments of the present disclosure by those skilled in the art.

First Embodiment

Figure 2:
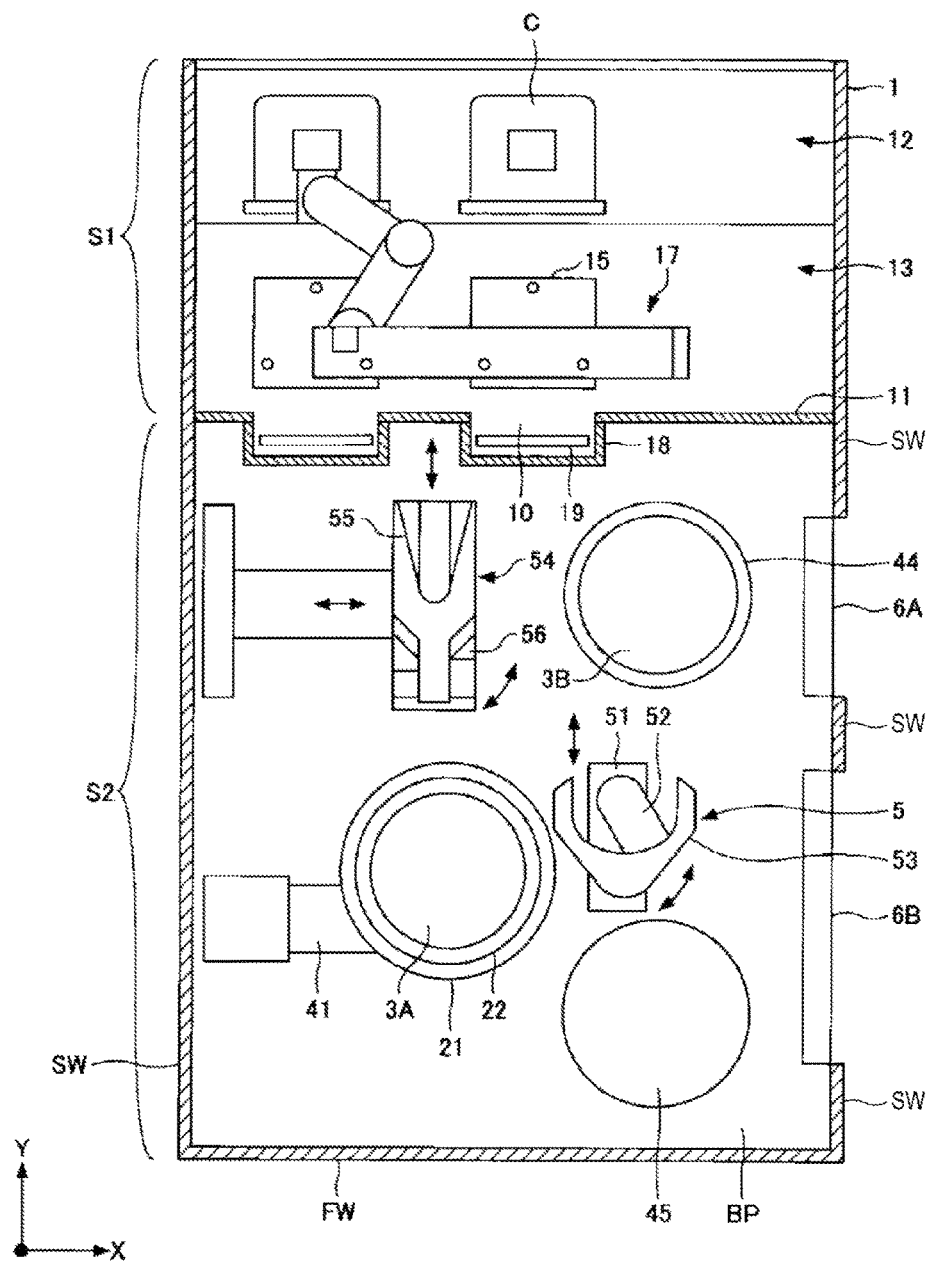
FIG. 2 is a schematic plane view of the film forming apparatus when viewed from a Z-axis direction indicated in FIG. 1.

First, a batch-type vertical film forming apparatus (hereinafter, referred simply to as "film forming apparatus") used as a substrate processing apparatus according to a first embodiment of the present disclosure will be described with reference to FIGS. 1 and 2. FIG. 1 is a schematic vertical sectional view showing an internal configuration of a film forming apparatus 10 according to the first embodiment of the present disclosure. FIG. 2 is a schematic plane view of the film forming apparatus 10 when viewed from a Z-axis direction indicated in FIG. 1.

As shown in FIGS. 1 and 2, the film forming apparatus 10 includes a housing 1. The housing 1 includes a carry-in/carry-out area S1 in and out which a carrier C configured to receive a substrate (hereinafter, referred to as a "wafer") therein is carried, and a processing area S2 which the wafer received in the carrier C is picked up and transferred into a reaction tube 2A (which will be described later). The carry-in/carry-out area S1 and the processing area S2 are partitioned by a partition wall 11. In this embodiment, a wafer on which a titanium (Ti) film is formed is used as the aforementioned wafer.

The carry-in/carry-out area S1 includes a first region 12 and a second region 13, which is disposed at the front side of the first region 12 in the negative Y-axis direction. A carrier loading table 14 (see FIG. 1) on which the carrier C is loaded is disposed at the first region 12. A closed-type FOUP (Front-Opening Unified Pod) made of, e.g., resin, may be used as the carrier C. A plurality of wafers W (e.g., about 25 wafers) having a diameter of, e.g., 300 mm, are arranged inside the FOUP in a shelf-shape. An openable/closable lid member (not shown) is mounted at the front side of the FOUP.

As shown in FIG. 1, a carrier loading table 15 and a plurality of carrier storage units 16 (e.g., two carrier storage units) are disposed in the second region 13. In the second region 13, there is installed a carrier transfer mechanism 17 configured to transfer the carrier C between the carrier loading table 14, the carrier loading table 15 and the carrier storage units 16. An opening portion 10H, which is in communication with the interior of the carrier C and the processing area S2, is formed at the front side of the carrier loading table 15 in the negative Y-axis direction. The opening portion 10H is opened and closed by a door 18. A lid opening/closing mechanism 19 is configured to open/close a lid of the carrier C which is loaded on the carrier loading table 15.

As shown in FIG. 1, the processing area S2 includes a reaction furnace receiving area S2T in which a reaction furnace 2 is disposed and a loading region S2L which is positioned below the reaction furnace receiving area S2T. The reaction furnace 2 disposed in the reaction furnace receiving area S2T includes the reaction tube 2A of a vertical shape with its lower end opened, a manifold 2M configured to support the reaction tube 2A, two gas injectors 2J which penetrate through the manifold 2M, and a heater (not shown). One of the two gas injectors 2J is connected to one process gas supply unit, e.g., a silicon (Si) raw material gas supply source (not shown) in which a Si raw material gas containing the silicon is stored, and the other of the two gas injectors 2J is connected to the other process gas supply unit, e.g., a nitriding gas supply source (not shown) in which a nitriding gas such as an ammonia gas is stored. An exhaust port (not shown), which is connected to an exhaust device (not shown) such as a vacuum pump, is formed in the reaction tube 2A. With this configuration, the Si raw material gas (or the nitriding gas) is supplied into the reaction tube 2A so that a titanium silicide ($TiSi_x$) film (or a TiN film) can be formed on a wafer (not shown) with a Ti film formed thereon, when the wafer is transferred into the reaction tube 2A with loaded on a wafer boat 3A or 3B (which will be described later) as a substrate holder.

In the loading region S2L, there are disposed the two wafer boats 3A and 3B configured to hold the plurality of wafers in a shelf-like, three stages 22, 44 and 45 on which the wafer boats 3A and 3B are mounted, and a boat transfer mechanism 5 (see FIG. 2) configured to transfer each of the wafer boats 3A and 3B among the three stages 22, 44 and 45. As shown in FIG. 2, the boat transfer mechanism 5 includes a multi-joint arm 52 which is vertically movable, rotatable around it horizontal shaft, and horizontally movable by an operation of an arm driving unit 51. An arm 53, which has a substantially U-shaped planar and is configured to hold the wafer boats 3A and 3B, is installed at a leading end of the multi-joint arm 52.

The stage 22 of the three stages 22, 44 and 45 is disposed below the reaction tube 2A and is vertically movable by a boat elevator 41. This allows the wafer boat 3A (or 3B) mounted on the stage 22 to be loaded/unloaded into/from the reaction tube 2A. Further, the stages 44 and 45 are provided to temporally hold the wafer boat 3A (or 3B) which is to be moved to the stage 22 or retreated therefrom As shown in FIG. 2, a wafer transfer mechanism 54 is disposed adjacent to the stage 44 in the loading region S2L. The wafer transfer mechanism 54 is configured to transfer the wafer between the wafer boat 3A (or 3B) mounted on the stage 44 and the carrier C loaded on the carrier loading table 15. The wafer transfer mechanism 54 includes a plurality of (e.g., five) forks 55 configured to hold the wafer W, and an extendible/retractable transfer body 56 configured to support the plurality of forks 55. The transfer body 56 is rotatable around the vertical shaft, movable upwards and downwards, and movable in the X-axis direction in FIG. 1. In FIG. 2, each of reference numerals 6A and 6B represents a fine filter unit (hereinafter, referred to as an "FF unit"), which will be described later.

The loading region S2L corresponds to an internal space of a box structure 30 (see FIG. 3A) which is defined by a front wall FW (see FIGS. 1 and 2), side walls SW (see FIG. 2) and a bottom plate BP (see FIGS. 1 and 2) of the housing 1, and the partition wall 11 (see FIGS. 1 and 2) and a ceiling plate 23 (see FIG. 1). Hereinafter, the box structure 30 will be described with reference to FIGS. 3B and 3B.

Figure 3A:
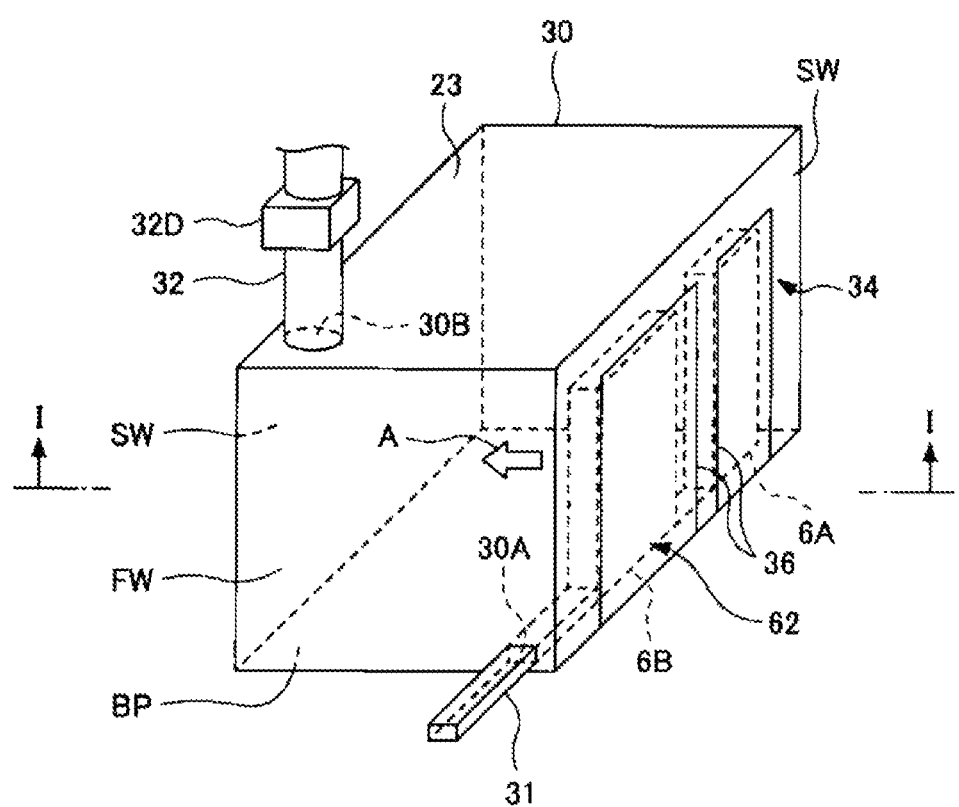
FIGS. 3A and 3B are views showing a box structure which defines a loading region in the substrate processing apparatus according to the first embodiment of the present disclosure.

As shown in FIG. 3A, the box structure 30 includes opening portions 34 formed at one of the side walls SW of the housing 1, the FF units 6A and 6B installed in the opening portions 34, a supply opening portion 30A formed below the front wall FW, and an exhaust opening portion 30B formed at the ceiling plate 23.

The supply opening portion 30A is connected to one end of a $N_2$ gas pipe 31 through which a nitrogen ($N_2$) gas flows to the FF units 6A and 6B. The other end of the $N_2$ gas pipe 31 is connected to a $N_2$ gas supply source (not shown). A mass flow controller and an on-off valve (not shown) may be installed in the $N_2$ gas pipe 31 to control the start and stop timing for supplying the $N_2$ gas, and the supply amount of the $N_2$ gas. Further, a pressure controller (not shown) may be disposed in the $N_2$ gas supply source or the $N_2$ gas pipe 31 such that the $N_2$ gas within the $N_2$ gas pipe 31 is set to have a higher pressure than the normal pressure.

Each of the FF units 6A and 6B includes a casing 61 of a substantially hexahedral shape, a supply port 62 formed below the front wall FW, a filter (not shown) disposed at a face of the internal space of the box structure 30, and a fan (not shown) which is configured to guide the $N_2$ gas introduced from the supply port 62 to the filter. The supply port 62 of each of the FF units 6A and 6B and the supply opening portion 30A of the box structure 30 are connected to each other through a specific pipe. With this configuration, the $N_2$ gas provided from the $N_2$ gas supply source is supplied in the interiors of the FF units 6A and 6B through the $N_2$ gas pipe 31 and the specific pipe. Then, the $N_2$ gas is introduced to the filter by the fan, and subsequently, is supplied into the internal space of the box structure 30 through the filter (see an arrow A indicated in FIGS. 3A and 3B). When the $N_2$ gas passes through the filter, any impurity contained in the $N_2$ gas is removed so that a clean $N_2$ gas is supplied into the internal space of the box structure 30. The casing 61 of each of the FF units 6A and 6B has a high gas-tightness to prevent the $N_2$ gas from being leaked from a portion other than the filter.

The exhaust opening portion 30B is connected to an exhaust pipe 32 which is configured to exhaust gas in the internal space of the box structure 30. The exhaust pipe 32 is equipped with a damper 32D as a pressure adjusting unit which is configured to adjust a flow rate of gas which flows through the exhaust pipe 32.

Figure 3B:
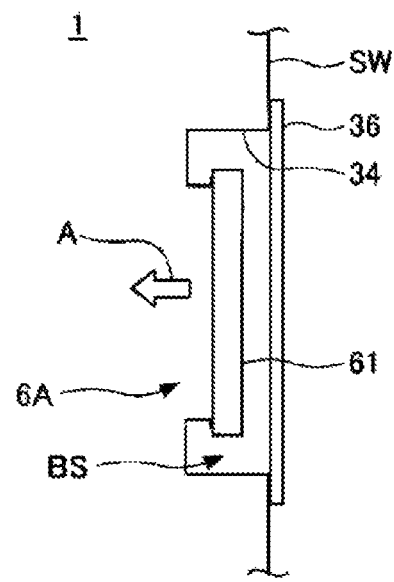

As shown in FIG. 3A, cover members 36, which are configured to cover each of the opening portions 34 formed in the FF units 6A and 6B, is disposed at the outer surface of the side wall SW of the box structure 30. As shown in FIG. 3B being a cross sectional view of a portion taken along a line I-I of FIG. 3A, a buffer space BS is formed between the side wall SW, and the cover member 36 (in a recess formed by the opening portion 34). In this embodiment, the cover member 36 may be a plate member having a larger size than that of the opening portion 34, and may be made of, e.g., an aluminum plate or a steel plate.

Further, the cover member 36 may be mounted on the outer surface of the side wall SW by a screw or an adhesive tape (including a two-sided adhesive tape). In some embodiments, the cover member 36 may be mounted on the outer surface of the side wall SW with, e.g., a packing interposed between them. The packing may be made of material such as silicone rubber, urethane rubber, butyl rubber or the like, for example. In this case, the cover member 36 is installed in the outer surface of the side wall SW to restrict the circulation of the $N_2$ gas between the buffer space BS and the outside without completely blocking the circulation.

Although not shown in FIGS. 3A and 3B, an opening portion 23H having an inner diameter substantially equal to that of the manifold 2M of the reaction furnace 2 is formed at the ceiling plate 23 of the box structure 30 (see FIG. 1). Through the opening portion 23H, the wafer boat 3A (or 3B) is moved upwards and downwards between the reaction furnace receiving area S2T and the loading region S2L. After the wafer boat 3A (or 3B) is loaded into the reaction tube 2A, the opening portion 23H is sealed by a lid 21. The lid 21 is movable upwards and downwards together with the wafer boat 3A (or 3B) by the boat elevator 41. Further, a flange 2F of the manifold 2M is gas-tightly fixed around the opening portion 23H.

The box structure 30 is gas-tightly constructed so that the internal space thereof is maintained in a pressure (positive pressure) higher than an atmospheric pressure by the $N_2$ gas which is introduced through a series of the $N_2$ gas pipe 31 and the FF units 6A and 6B. Specifically, in a case where the $N_2$ gas pipe 31 is connected to the supply opening portion 30A, and the exhaust pipe 32 is connected to the exhaust opening portion 30B. Further, the FF units 6A and 6B are installed in the opening portions 34, and the reaction tube 2A is disposed in the opening portion 23H through the manifold 2M. When a utility equipment supply the $N_2$ gas into the box structure 30 at a pressure and a flow rate for a clean room in which the aforementioned film forming apparatus 10 is installed, the internal space of the box structure 30 may be kept at a gas-tight state enough to maintain the positive pressure. Further, a pressure of the internal space may be determined by adjusting a pressure and amount of the $N_2$ gas introduced from the $N_2$ gas pipe 31 and the damper 32D of the exhaust pipe 32. For example, the pressure of the internal space may fall within, e.g., a range of several tens to 200 of Pa, with respect to the atmospheric pressure.

In the box structure 30 configured as above according to this embodiment, when the $N_2$ gas is supplied through the $N_2$ gas pipe 31 to maintain the internal space of the box structure 30 in the positive pressure, the gas existing in the internal space is exhausted from the exhaust pipe 32 to the outside together with the $N_2$ gas which is supplied from the FF units 6A and 6B into the internal space. With this configuration, the internal space is purged by the supplied $N_2$ gas, which makes it possible to reduce an oxygen concentration in the internal space of the box structure 30.

Figure 4:
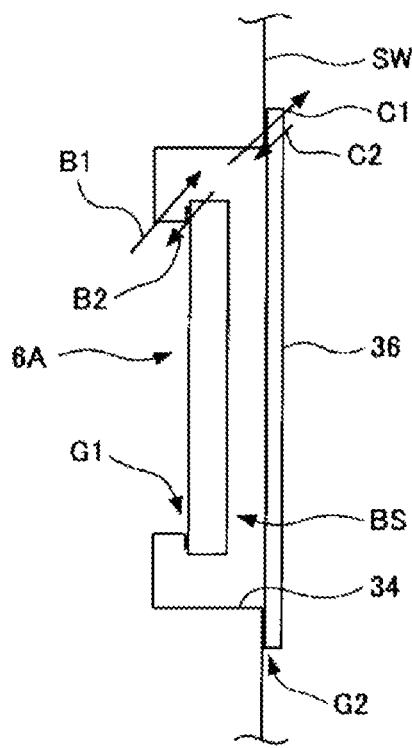
FIG. 4 is a view illustrating effects provided by a housing of the substrate processing apparatus according to the first embodiment of the present disclosure.

Meanwhile, the $N_2$ gas supplied into the internal space of the box structure 30 is exhausted through the exhaust pipe 32, but may be leaked into the buffer space BS through, e.g., a gap G1 (a first gap), which may be formed between the side wall SW of the box structure 30 and the FF unit 6A (or 6B), as schematically indicated by an arrow B1 in FIG. 4. Subsequently, the $N_2$ gas leaked into the buffer space BS may be leaked to the outside (atmospheric atmosphere) through, e.g., a gap G2 (a second gap), which may be formed between the cover member 36 and the outer surface of the side wall SW, as schematically indicated by an arrow C1 in FIG. 4. With this arrangement, the buffer space BS is also purged by the $N_2$ gas introduced from the internal space of the box structure 30, which reduces the oxygen concentration in the buffer space BS.

When the $N_2$ gas is leaked from the internal space of the box structure 30 into buffer space BS, as schematically indicated by an arrow B2 in FIG. 4, a portion of the gas within the buffer space BS may be inversely diffused into the internal space of the box structure 30. For example, when there is no cover member 36 (that is, the buffer space BS formed by installing the cover member 36) so that the $N_2$ gas is directly leaked from the internal space of the box structure 30 to the outside, the outside air (corresponding to about 21% of the oxygen concentration) may be inversely diffused into the internal space. Meanwhile, in this embodiment, since the oxygen concentration of the buffer space BS is reduced as described above, an amount of oxygen to be inversely diffused from the buffer space BS into the internal space is reduced. This further reduces the oxygen concentration in the internal space.

Moreover, since the oxygen concentration in the internal space (i.e., the loading region S2L) of the box structure 30 is reduced, an amount of oxygen to be introduced from the internal space into the reaction tube 2A is also reduced. This sufficiently prevents oxidation of the Ti film formed on the wafer which is loaded into the reaction tube 2A.

With the leakage (as indicated by the arrow C1) of the $N_2$ gas from the buffer space BS to the outside, as schematically indicated by an arrow C2 in FIG. 4, oxygen in the outside air may be inversely diffused into the buffer space BS. However, an amount of the inversely diffused oxygen is much smaller than an amount of the $N_2$ gas which was leaked from the buffer space BS to the outside. Accordingly, the oxygen concentration in the buffer space BS can be controlled to be lower than that in the air.

As an example, a box structure has the same gas-tightness as that of a vacuum chamber in which a substrate is processed in a depressurized condition, and a $N_2$ gas pipe and an exhaust pipe are gas-tightly installed. In this case, the box structure can be purged by the $N_2$ gas while the $N_2$ gas is efficiently prevented from being leaked from the box structure to the outside. Thus, the less oxygen is inversely diffused. This reduces the oxygen concentration in the box structure. Unfortunately, the manufacture of such a box structure results in increased costs, which leads to an increase of the cost of manufacturing an IC (integrated Circuit).

In contrast to this case, in the box structure 30 of the housing 1 according to the first embodiment of the present disclosure, the portion through which the $N_2$ gas may be leaked from the internal space to the outside is covered by the cover member 36. Thus, the oxygen concentration in the internal space is reduced, which makes it possible to drastically decrease the manufacturing cost of the housing 1. Moreover, since the cover member 36 can be installed in a box structure (or housing) of an existing substrate processing apparatus, the oxygen concentration in the internal space is reduced, which eliminates the need of an extensive reconstruction for reducing the oxygen concentration. Further, in a case where the cover member 36 is installed in the box structure 30 using, e.g., an adhesive tape, an operator can easily maintain or replace the FF unit 6A (or 6B) with a new one by removing the cover member 36.

Second Embodiment

Figure 5:
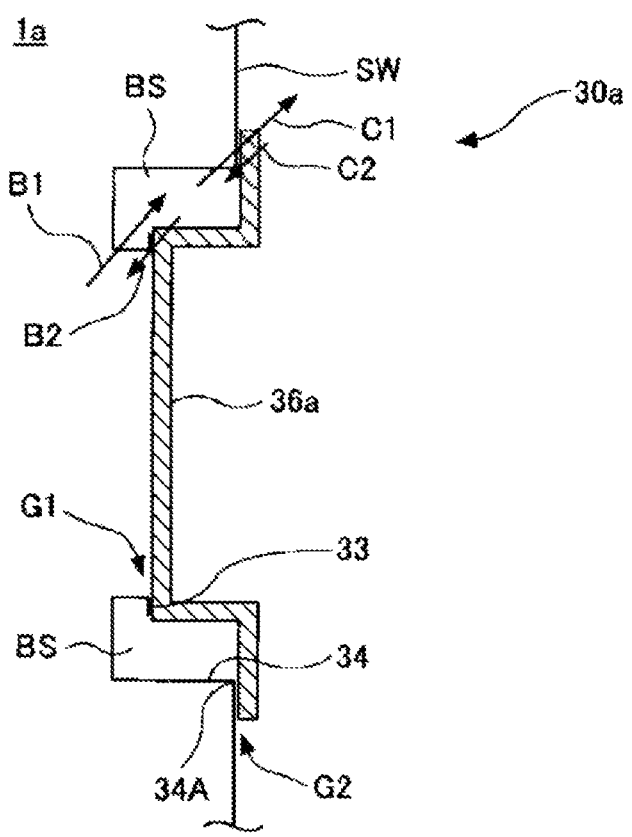
FIG. 5 is a view showing a housing according to a second embodiment of the present disclosure.

FIG. 5 is a view showing a housing 1a according to a second embodiment of the present disclosure. The housing 1a according to the second embodiment is different from the housing 1 according to the first embodiment in that a cover member 36a is installed in a side wall SW of a box structure 30a and therefore, only the difference will be described. The other configurations are similar to those of the first embodiment and, therefore a description thereof will be omitted and will not be repeated. Further, in the second embodiment, the same or equal elements as those of the first embodiment are indicated by the same reference numerals, where applicable, and their descriptions are not repeated.

FIG. 5 illustrates a cross sectional configuration which is focused around the opening portion 34 of the box structure 30a of the housing 1a according to the second embodiment of the present disclosure. In the housing 1a according to the second embodiment, the opening portion 34 is covered by only the cover member 36a. The housing 1a of the second embodiment is different from the housing 1 according to the first embodiment in which the opening portion 34 is covered by both the casing 61 and the cover member 36. Specifically, in the housing 1 according to the first embodiment, the box structure 30 is constructed such that an inner opening of the opening portion 34 is covered by the casing 61, and subsequently, an outer opening of the opening section 34 is finally covered by the cover member 36 contact with the side wall SW. Meanwhile, in the housing 1a according to the second embodiment, although the configurations of the opening portion 34 are similar to those in the housing 1 according to the first embodiment, the opening portion 34 is blocked by only the cover member 36a having a U-shaped portion inwardly bent. As described above, the opening portion 34 may be covered by a single member, i.e., the cover member 36a, which is fabricated in conformity to a shape of the opening portion 34, without two members such as the casing 61 and the cover member 36.

As shown in FIG. 5, to form a mounting surface 33, an end portion of the opening portion 34 is bent from a bend starting point 34A on the side wall SW inwardly and vertically, and bent toward the center of the opening portion 34 parallel to the side wall SW. Further, the end portion of the opening portion 34 is bent outwardly perpendicular to the side wall SW, and finally, bent parallel to the side wall SW to face the outer periphery of the opening portion 34. The mounting surface 33 is a surface with which the cover member 36a can be brought into contact. The cover member 36a can be mounted on the mounting surface 33 using a mounting means (or coupling means) including an adhesive, a screw or the like, as described in the first embodiment.

Further, the mounting surface 33 is positioned inwardly from the bend starting point 34A on the side wall SW in the end portion of the opening portion 34 so that the mounting surface 33 and the bend starting point 34A is spaced apart from each other by a predetermined distance. This forms the buffer space BS between the bend starting point 34A and the mounting surface 33. The similar configurations are formed along the upper and lower peripheries of the end portion of the opening portion 34 so that the buffer space BS is formed over the entire circumference of the opening portion 34. Further, the end portion of the opening portion 34 has a shape in which it is deeply bent from the bend starting point 34A inwardly in a vertical direction, and also is folded outwardly in the vertical direction so that a relatively large space is formed in a direction perpendicular to the side wall SW, thus obtaining the buffer space BS having a relatively large capacity.

Similar to the first embodiment, the first gap G1 is formed in a contact surface between the mounting surface 33 and the cover member 36a. Specifically, the cover member 36a is mounted in the mounting surface 33 with degrees of gas-tightness and adhesion to accept the leakage of the $N_2$ gas from the internal space. This allows the $N_2$ gas supplied into the internal space to be leaked into the buffer space BS through the first gap G1.

Further, the cover member 36a is mounted in the side wall SW in a manner analogous to that discussed in the first embodiment. The cover member 36a is mounted in the side wall SW by bring the cover member 36a into contact with the bend starting point 34A and an outer region therearound. Similarly, the mounting method using the adhesive tape, the screw or the like, which is discussed in the first embodiment, may be used in mounting the cover member 36a in the side wall SW. Further, the second gap G2 is formed in a contact portion between the cover member 36a and the side wall SW, which allows the $N_2$ gas to be leaked from the buffer space BS to the outside. With this configuration, the $N_2$ gas which was leaked into the buffer space BS through the first gap G1, is subsequently leaked from the buffer space BS to the outside through the second gap G2.

While the mounting of the cover member 36a in the side wall SW needs to be securely performed using the adhesive tape, the screw or the like, the cover member 36a may be simply brought into contact with the mounting surface 33 by strongly pressing the cover member 36a against the mounting surface 33, without having to use a fixed specific mounting method. Such a configuration can be realized by properly adjusting a forming position of the mounting surface 33 in a depth direction and a bending position of the cover member 36a.

As described above, while in the housing 1a according to the second embodiment, the opening portion 34 is covered by only the cover member 36a without mounting the casing 61 of the respective FF unit, the first gap G1, the buffer space BS and the second gap G2 can be formed similar to the first embodiment, thus reducing the oxygen concentration in the internal space of the box structure 30a. Therefore, according to the housing 1a of the second embodiment, it is possible to decrease the number of components to thereby decrease manufacturing cost while reducing the oxygen concentration in the internal space. Further, the shape of the cover member 36a has an inwardly-concaved bent shape, which makes it possible to realize a space-saving.

Further, while in the second embodiment, the opening portion 34 has been described to be covered by the cover member 36a, the same operation and effects can be obtained even if the cover member 36a is replaced with the casing 61 of the respective FF unit.

Third Embodiment

FIG. 6 is a view showing a housing 1b according to a third embodiment of the present disclosure. In the housing 1b according to the third embodiment, only a configuration of opening portions 35 formed on the side wall SW of a box structure 30b is different from that of the housings 1 and 1a according to the first and second embodiments. Thus, only the difference will be described. The other configurations are similar to those of the first and second embodiments and, therefore a description thereof will be omitted and will not be repeated. Further, in the third embodiment, the same or equal elements as those of the first and second embodiments are indicated by the same reference numerals, where applicable, and their descriptions are not repeated.

The configuration of the housing 1b according to the third embodiment is different from that of the housings 1 and 1a according to the first and second embodiments in that each of mounting surfaces 33a of end portions of the opening portions 35 which are formed in the side wall SW of the box structure 30b is formed in plane with the side wall SW without being formed in the internal space side. Further, the third embodiment is different from the first embodiment and is common to the second embodiment in that the opening portion 35 is covered by only the cover member 36 without using the casing 61.

As shown in FIG. 6, each of the mounting surfaces 33a is formed by bending each of the end portions of the opening portions 35 from a bend starting point 35A on the side wall SW inwardly in a vertical direction, and followed by bending it toward the center of the opening portion 35 parallel to the side wall SW. Further, each of the mounting surfaces 33a is followed by bending it outwardly perpendicular to the side wall SW, and followed by bending it toward the center of the opening portion 35 in plane with the side wall SW. This arrangement results in a buffer space BS such as a recess which is formed inwardly starting at each of the bend starting points 35A.

Each of the cover members 36 has a flat plate shape similar to the first embodiment and is formed to cover the entire of the opening portion 35. Each of the cover members 36 is mounted to bring into contact with the mounting surface 33a, the bend starting point 35A and a portion of an outer region starting at the bend starting point 35A on the side wall SW. The buffer space BS of a small capacity is formed between the mounting surface 33a and the bend starting point 35A over the entire periphery of the opening portion 35. The cover member 36 may be mounted using a mounting means such as an adhesive tape, a screw or the like similar to the first and second embodiments. Further, the outermost side of the cover member 36 may be surely mounted on the portion of the outer region starting at the bend starting point 35A on the side wall SW using the aforementioned mounting means, while the cover member 36 may be brought into contact with the mounting surface 33a by a pressure to be applied to the cover member 36 depending on an intended use, which is similar to the second embodiment.

In such a simple configuration, the housing 1b according to the third embodiment includes a first gap G1 formed at a contact surface between the mounting surface 33a and the cover member 36, a second gap G2 formed at a contact surface between the side wall SW and the cover member 36, and the buffer space BS formed between the first gap G1 and the second gap G2. The first and second gaps G1 and G2 permit the $N_2$ gas existing in the internal space to be leaked to the outside. With this configuration, when the $N_2$ gas is supplied into the internal space so that the internal space is kept at the positive pressure, the $N_2$ gas is leaked from the internal space into the buffer space BS through the first gap G1 and subsequently, is leaked from the buffer space BS to the outside through the second gap G2. This reduces the oxygen concentration in the internal space.

As described above, according to the housing 1b of the third embodiment, the opening portion 35 is formed in a simplified shape and the cover member 36 is also formed in a simplified flat shape. Therefore, it is possible to further reduce manufacturing costs including a work cost of the opening portions 35 and the cover member 36. Moreover, similar to the second embodiment, the opening portions 35 are covered by only the cover member 36. Therefore, it is possible to reduce the number of components, which decreases the manufacturing costs and realizes a space-saving. Further, although the casing 61 of the respective FF unit is employed as the cover member 36, the same operation and effects may be obtained.

As described above, according to the housings 1a and 1b of the second and third embodiments, it is possible to reduce the number of components and the manufacturing costs, and to efficiently reduce the oxygen concentrations in the internal spaces of the box structures 30a and 30b.

In the second and third embodiments, the opening portions 34 and 35 have been described to have a specific shape as described above but are not limited thereto. For example, if the mounting surfaces 33 and 33a parallel to the side wall SW can be formed inwardly from the bend starting points 34A and 35A by bending the end portions of the opening portions 34 and 35, a various of modifications can be made. As an example, in the second embodiment, the end portion of each of the opening portions 34 is bent in a depth direction perpendicular to the side wall SW and subsequently, is bent inwardly in a direction parallel to the side wall SW such that the mounting surfaces 33 can be formed at edges of the subsequently bent portions. Accordingly, if the cover member 36a is more deeply bent in the depth direction, it is possible to obtain the same operation and effects as the second embodiment in which the first and second gaps G1 and G2 are formed. The similar modification is also applicable to the third embodiment.

As described above, the shapes of the end portions of the opening portions 34 and 35, and the shapes of the cover members 36a and 36 to cover the opening portions 34 and 35 may be changed widely as usage.

Further, while the end portions of the opening portions 34 and 35 have been described to have a bent shape which is formed by bending a single member using a bending work, the present disclosure is not limited thereto. In some embodiments, the end portions of the opening portions 34 and 35 may be formed by a bonding process such as a welding.

Further, this embodiment has a mechanism which decreases the oxygen concentration in the internal space by keeping the internal space in the positive pressure, and this mechanism is similar to that described in the first embodiment and. Therefore a description thereof will be omitted to avoid duplication.

Fourth Embodiment

Figure 7A:
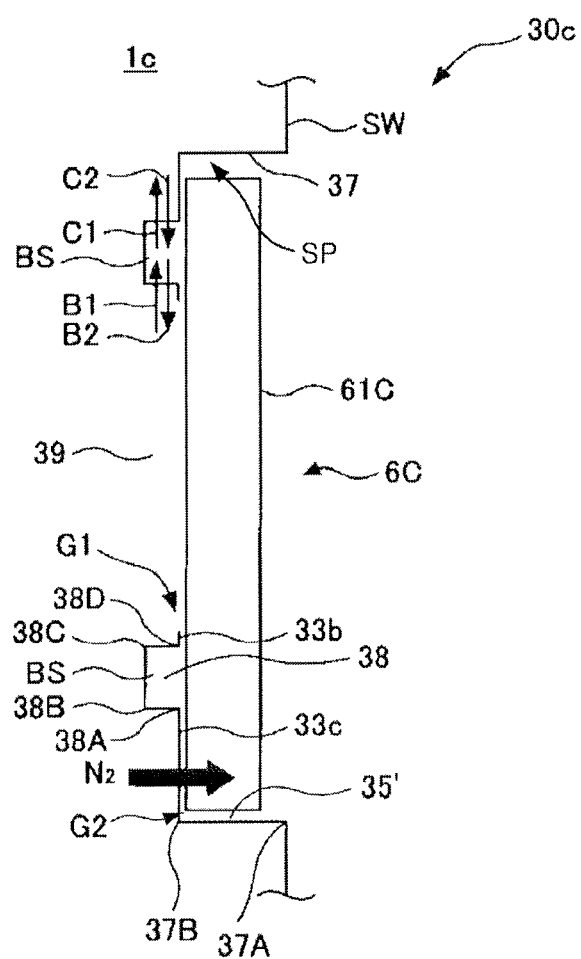

FIGS. 7A and 7B are views showing a housing 1c according to a fourth embodiment of the present disclosure. Specifically, FIG. 7A illustrates a lateral cross sectional view showing the example of the housing 1c, and FIG. 7B illustrates the relationship between a FF unit 6C and an opening portion 37. The housing 1c according to the fourth embodiment includes opening portions 37. An end portion of each of the opening portions 37 is bent plural times. Concave (or recess) portions 38 are formed in the vicinity of a leading end of the end portion of the opening portions 37. Specifically, each mounting surface 33c is formed by bending the end portion of the opening portion 37 inwardly starting at a bend starting point 37A on the side wall SW in a direction perpendicular to the side wall SW, and bending it toward the center of the opening portion 37 starting at a corner 37B in a direction parallel to the side wall SW. Subsequently, each of the concave portions 38 and each of the mounting surfaces 33b are formed by bending the end portion of the opening portion 37 inwardly starting at a bend starting point 38A of the concave portion 38 in the direction perpendicular to the side wall SW, and bending it toward the center of the opening portion 37 starting at a corner 38B in the direction parallel to the side wall SW. In addition, each of the concave portions 38 and each of the mounting surfaces 33b are formed by further bending it outwardly starting at a corner 38C in the direction perpendicular to the side wall SW, and bending it inwardly toward the center of the opening portion 37 starting at a corner 38D while being arranged at the same height as that of the bend starting point 38A. With this arrangement, an opening 39 is formed between the upper and lower mounting surfaces 33b.

The opening portion 37 of the housing 1c according to the fourth embodiment has a configuration in which, in a state that each of the opening portions 35 of the housing 1b according to the third embodiment shown in FIG. 6 is formed, the outer side wall SW is further bent twice to form additional opening portions 35' outwardly by one stage. Specifically, while in the housing 1b according to the third embodiment, the cover member 36 is mounted to cover the side wall SW, in the housing 1c according to the fourth embodiment, the concave portions 38 are formed at positions recessed inwardly from the side wall SW so that the casing 61C of the FF unit 6C acting as a cover member is configured to be mounted at an inner position than the side wall SW. The shape of the concave portion 38 is similar to that of the opening portion 35 shown in FIG. 6. With this configuration, the concave portion 38 is covered by the cover member 36 of the plate shape so that the buffer space BS and the first and second gaps G1 and G2 can be formed similar to that shown in FIG. 6.

Meanwhile, in the housing 1c according to the fourth embodiment, the buffer space BS and the first and second gaps G1 and G2 are formed using the casing 61C of the FF unit 6C instead of the cover member 36. That is, since the mounting surfaces 33b and 33c and the concave portion 38 which are required to form the buffer space BS and the first gaps G1 and G2, are formed inwardly from the side wall SW, the FF unit 6C which needs to be formed inwardly from the side wall SW can be formed instead of the cover member 36. In other words, in the housing 1c according to the fourth embodiment, one stepped space is formed in the opening portion 37 and the FF unit 6C can be mounted in the stepped space. Further, since the side wall SW is not used as one of the aforementioned mounting surfaces, the mounting surfaces 33b and 33c are formed over the entire periphery of the opening portion 37.

In the first embodiment, the FF units 6A and 6B are mounted inside the opening portion 34 and the opening section 34 is covered by the cover member 36. In the second and third embodiments, the FF units 6A and 6B are mounted inwardly from the opening portions 34 and 35, and the opening portions 34 and 35 are covered by the cover members 36a and 36, respectively. Meanwhile, in the housing 1c according to the fourth embodiment, the concave portions 38 and the opening 39 are blocked (or covered) by the casing 61C of the FF unit 6C. The opening portion 37 is not fully covered and the casing 61C of the FF unit 6C is received in the stepped space formed in the opening portion 37 so that the casing 61C of the FF unit 6C occupies almost all of the stepped space of the opening portion 37. Specifically, the casing 61C is received in the opening portion 37 with a certain clearance kept between upper and lower sides, instead of fully blocking the interior of the opening portion 37.

As shown in FIG. 7B, for example, the FF unit 6C is mounted along one vertical side of the opening portion 37 like a cover of a refrigerator such that the opening portion 37 can be opened and closed. The $N_2$ gas pipe 31 is installed inside the opening portion 37 and has a supply port 31A. Further, the supply port 62 is formed below the FF unit 6C. When the casing 61C of the FF unit 6C is closed, the supply port 62 is in communication closely with the supply port 31A of the $N_2$ gas pipe 31 so that the $N_2$ gas supplied from the $N_2$ gas pipe 31 is introduced into the FF unit 6C through the supply port 62. As described above, the FF unit 6C is received in the opening portion 37 with a slight clearance for door opening/closing kept therebetween while covering the concave portions 38 and the opening 39. Further, an outer surface of the casing 61C of the FF unit 6C is positioned inwardly from the side wall SW instead of being protruded outwardly therefrom. With this configuration, it is possible to arrange both the housings 1c having the same configuration or both the film forming apparatuses 10 including the housing 1c in close proximity with each other. This allows a plurality of the film forming apparatuses to be arranged by namely a side-by-side scheme, which reduces a footprint and realizes a space-saving.

As shown in FIG. 7A, the casing 61C of the housing 1c according to the fourth embodiment is configured to bring into contact with the mounting surfaces 33b and 33c to thereby cover and block the concave portions 38 and the opening 39. The block of the concave portions 38 forms the buffer spaces BS. At this time, the first gaps G1 are formed between the mounting surfaces 33b and the casing 61C, and the second gaps G2 are formed between the mounting surfaces 33c and the casing 61C. Similar to the first to third embodiments, the first and second gaps G1 and G2 allow the $N_2$ gas existing in the internal space to be leaked to the outside therethrough. That is, when the $N_2$ gas is supplied into the internal space and the internal space is kept in a positive pressure, the $N_2$ gas is leaked from the internal space to the buffer spaces BS through the first gaps G1, and subsequently, is leaked from the buffer spaces BS to the outside through the second gaps G2. This reduces the oxygen concentration in the internal space. This is similar to that discussed in the first to third embodiments and, therefore the detail descriptions of a mounting method of the casing 61C and a mechanism for reducing the oxygen concentration in the internal space will be omitted and will not be repeated.

According to the housing 1c of the fourth embodiment, the concave portions 38 and the mounting surfaces 33b and 33c are formed inwardly from the side wall SW, instead of using the side wall SW as a portion of the mounting surfaces, and the concave portions 38 are formed as the buffer spaces BS. In this arrangement, the casing 61C of the FF unit 6C is mounted on the mounting surfaces 33b and 33c so that the concave portions 38 and the opening 39 are blocked, thus forming the buffer spaces BS and the first and second gaps G1 and G2. This reduces the need to prepare, e.g., the cover members 36 and 36a to cover the opening portion 37, thereby eliminating members (i.e., the cover members 36 and 36a) protruded from the side wall SW. Therefore, it is possible to reduce a space required to install the housing 1c and dispose a plurality of the housings 1c adjacent to each other.

In FIGS. 7A and 7B, while the casing 61C of the FF unit 6C has been described to be used as a cover member to cover the concave portions 38 and the opening 39, the FF unit 6C may be mounted in the internal space behind the concave portions 38 and the opening 39. In this case, the cover member 36 may be used to cover the concave portions 38 and the opening 39 as heretofore. Even in such a case, the buffer spaces BS and the first and second gaps G1 and G2 may be formed behind the side wall SW, thus eliminating the cover member to cover the side wall SW. This makes it possible to dispose a plurality of the housings 1c adjacent to each other.

In the fourth embodiment, a broad cover member including the mounting surfaces 33b and 33c, the concave portions 38, and the casing 61C of the FF unit 6C may be formed in various shapes as long as it can be formed behind the side wall SW. As an example, in the arrangement shown in FIG. 5, a stepped portion SP of one stage may be formed and the cover member 36a may be mounted behind the side wall SW.

As described above, according to the housing 1c of the fourth embodiment, it is possible to install a plurality of the film forming apparatuses 10 adjacent to each other in various fashions as long as the stepped portion SP is formed in the opening portion 37 and the broad cover member including the casing 61C of the FF unit 6C is mounted behind the side wall SW.

Experimental Example

Figure 8:
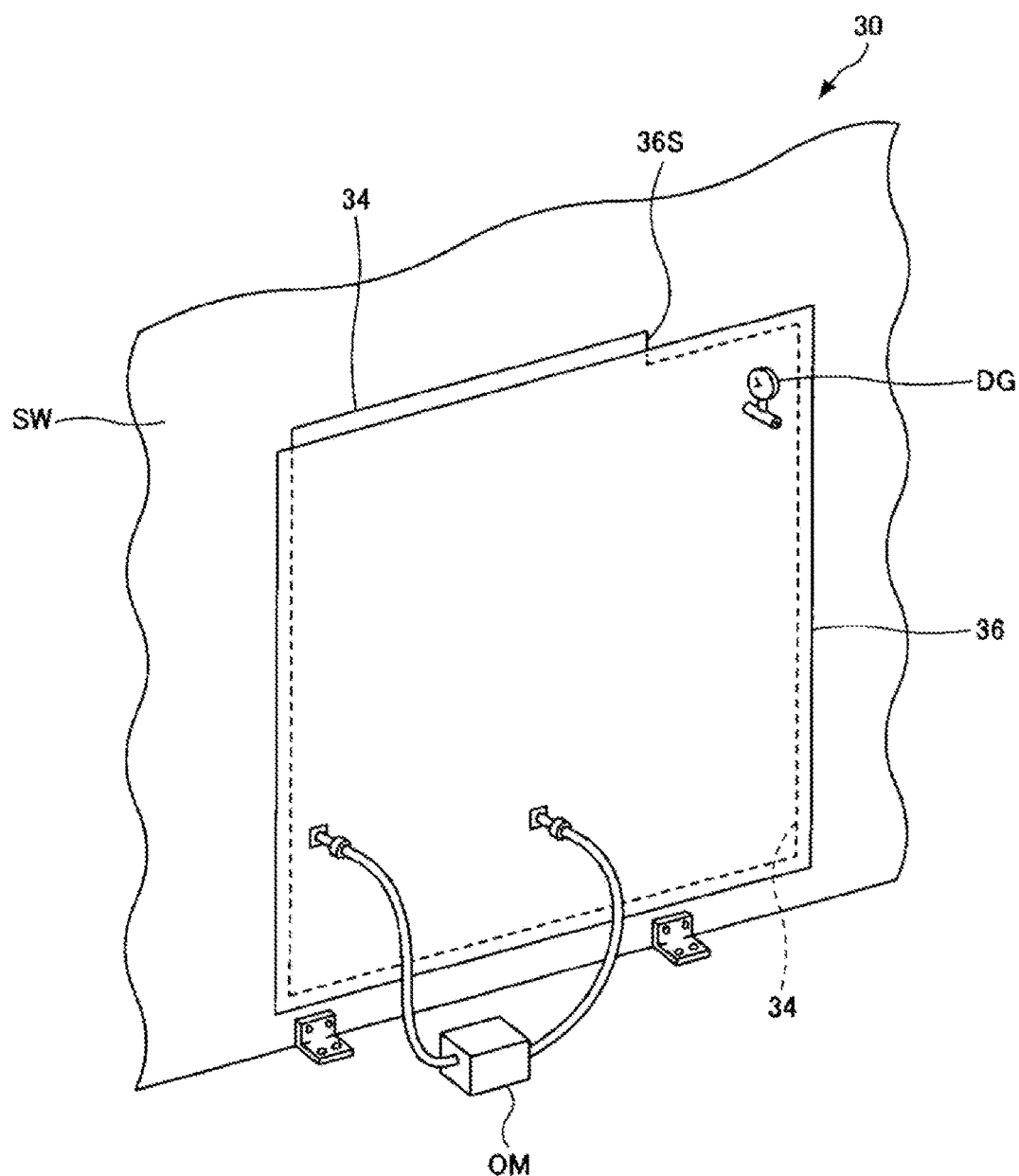
FIG. 8 is a view showing results of an experiment which is performed to illustrate effects provided by the housing of the substrate processing apparatus according to the first embodiment of the present disclosure.

Next, an experiment and its results will be described to confirm the effects of an embodiment of the present disclosure. This experiment was performed using the film forming apparatus 10 including the housing 1 according to the first embodiment. FIG. 8 is a perspective view showing a portion of the box structure 30 of the film forming apparatus 10 (see FIGS. 1 and 2) which is used in the experiment, and the cover member 36 mounted in the box structure 30. As shown in FIG. 8, used in the experiment are a differential pressure gauge (DG) to measure a difference in pressure between the buffer space BS and the outside (atmospheric atmosphere), and an oxygen meter (OM) to measure an oxygen concentration of the buffer space BS. Further, two gas pipe joints for a vacuum mechanism are mounted in the cover member 36. The oxygen concentration in the buffer space BS was measured by connecting the two gas pipe joints and the oxygen meter (OM) by a specific pipe and performing a sampling on gas in the buffer space BS. In addition, the oxygen concentration in the internal space was measured by further arranging the oxygen meter in the internal space of the box structure 30.

In the box structure 30 used in the experiment, a structural gap (having enough space only for a finger to enter therethrough) was created between the cover member 36 and the box structure 30. This structural gap was sealed by an adhesive tape or a sealing member (which is indicated by a reference numeral "36S" in FIG. 8) made of rubber.

The experiment was performed plural times by changing a method of mounting the cover member 36 in the box structure 30. This method is set forth in FIG. 10. For example, under Condition 1, the cover member 36 was mounted in the box structure 30 using a one-sided adhesive tape and the structural gap was also sealed by the one-sided adhesive tape. For the sake of comparison, the oxygen concentration in the internal space of the box structure 30 was measured with respect to a case (comparative example) where the cover member 36 is not mounted.

Figure 9:
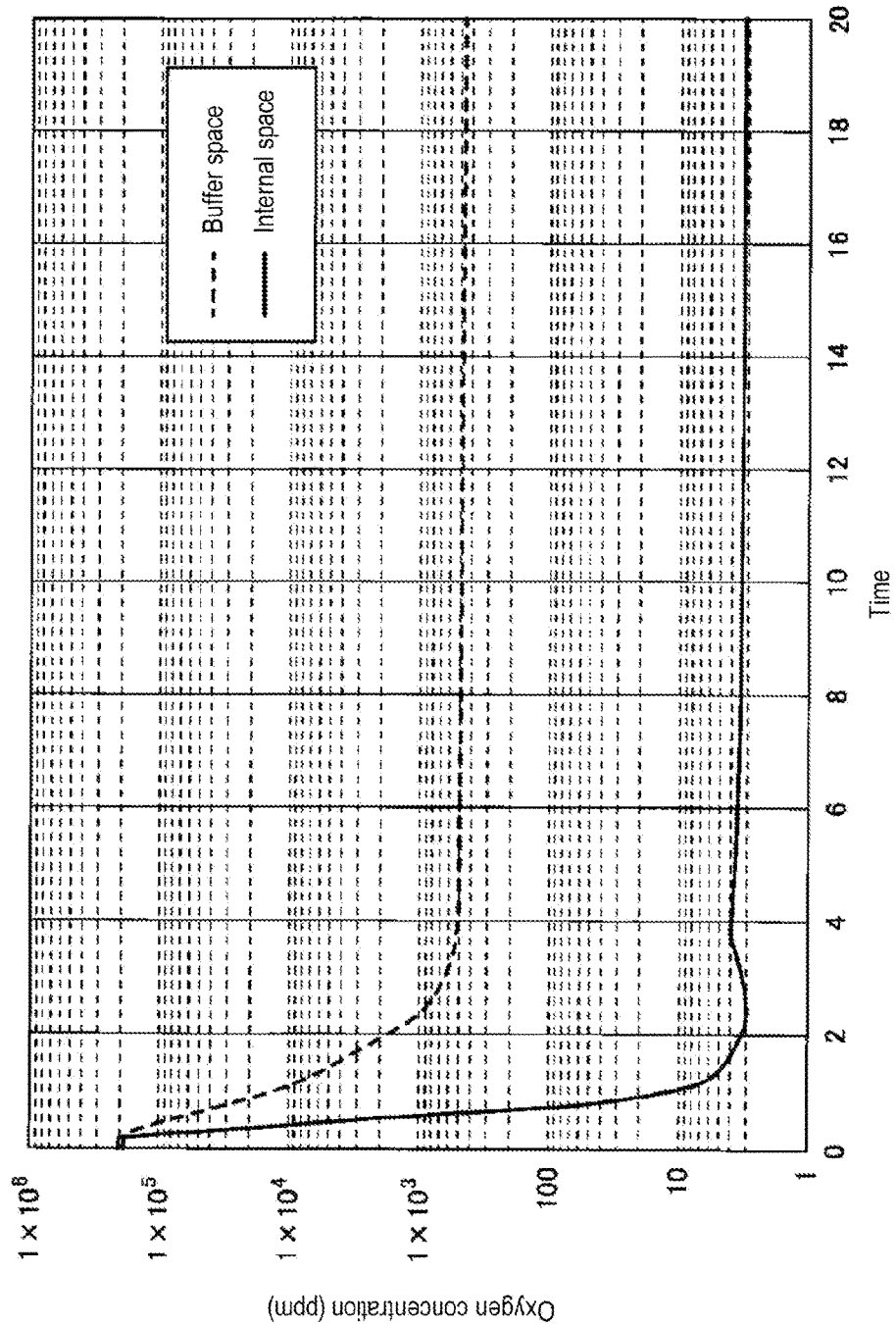
FIG. 9 is a graph showing the variation of oxygen concentration with respect to time in an internal space of a box structure and a buffer space.

FIG. 9 is a graph showing the variation of the oxygen concentration with respect to time in the internal space of the box structure 30 and the buffer space BS, which represents an oxygen concentration starting from when the $N_2$ gas is supplied into the box structure 30 to make a pressure of the internal space higher than an atmospheric pressure by 1000 Pa, after a maintenance for the film forming apparatus 10 shown in FIGS. 1 and 2. It was found from FIG. 9 that, after about ten minutes after the supply of the $N_2$ gas, the oxygen concentration in the internal space of the box structure 30 is decreased up to about 3 ppm.

In FIG. 10, the minimum oxygen concentrations in the internal space of the box structure 30 and the buffer space BS are shown under respective conditions. It was found that, in case where the cover member 36 is mounted in the box structure 30 using the one-sided adhesive tape and the gap is also sealed by the one-sided adhesive tape (under Conditions 1 and 2), the oxygen concentration in the buffer space BS is about 13%, which is lower than an oxygen concentration in atmosphere by about 21%. Also, it was found that an oxygen concentration in the internal space of the box structure 30 was about 4 ppm, which is lower than 5 ppm when the cover member 36 is not used (comparative example).

Further, it was found that, when the cover member 36 is mounted in the box structure 30 using the one-sided adhesive tape and the structural gap is sealed by the sealing member 36S (see FIG. 8) (under Condition 3), the oxygen concentration in the buffer space BS is decreased up to 600 ppm and the oxygen concentration in the internal space of the box structure 30 is decreased up to 3.2 ppm. Further, the measurement has shown that, when being again performed under the same condition as the Condition 3 (under Condition 4), the oxygen concentration in the buffer space BS is 460 ppm and the oxygen concentration in the internal space is 3.2 ppm. Since the structural gap is sealed by the sealing member 36S, an amount of leakage of the $N_2$ gas from the buffer space BS to the outside is decreased (see the arrow C2 indicated in FIG. 4). Thus, air in the atmosphere may be reduced to be reversely diffused into the buffer space BS.

Also, the experiment has shown that, in case where the structural gas is sealed by the sealing member 36S and the cover member 36 is mounted in the box structure 30 using the two-sided adhesive tape instead of the one-sided adhesive tape (under Condition 5), the oxygen concentration in the buffer space BS is 520 ppm and the oxygen concentration in the internal space is 3.2 ppm, which shows no significant difference between the use of the one-sided adhesive tape and the use of the two-sided adhesive tape.

Meanwhile, the experiment has shown that, in case where the structural gap is sealed by the sealing member 36S and is further sealed by the one-sided adhesive tape, and the cover member 36 is mounted in the box structure 30 using the two-sided adhesive tape, the oxygen concentration in the buffer space BS is decreased up to 333 ppm. Even in this case, the oxygen concentration in the internal space of the box structure 30 was 3.2 ppm, which has no manifestation of a significant change. From the aforementioned observations, in case the oxygen concentration in the buffer space BS is reduced to several hundred ppm, e.g., 600 ppm or less, the oxygen concentration in the internal space of the box structure 30 can be also fully reduced.

In addition to the aforementioned experiment, another experiment was performed to measure the oxygen concentration in the internal space in case where the cover member 36 is mounted in the box structure 30 using the adhesive tape in ten film forming apparatuses. This experiment has shown that an average of minimum oxygen concentrations is 3.8 ppm and a standard deviation ($\sigma$) is 0.37.

Further, under Condition 1, a measurement using the differential pressure gauge (DG) (see FIG. 8) has shown that a pressure within the buffer space BS is approximately the atmospheric pressure. From this observation, it is contemplated that the gas in the buffer space BS is leaked to the outside at approximately the same leakage rate as that of the $N_2$ gas which is leaked from the internal space of the box structure 30 into the buffer space BS. Also, it was found that although the cover member 36 is not mounted in the box structure 30 with a high gas-tightness, the oxygen concentration in the internal space can be reduced.

While certain embodiments and certain experiments have been described, the present disclosure is not limited to these embodiments and experiments, and may be changed or modified within the scope of the present disclosure.

Although, in the above embodiments, it has been described that the FF units 6A and 6B are mounted in the box structure 30, the present disclosure is not limited thereto. In some embodiments, if the interior of the box structure 30 need to be kept in a positive pressure by the supply of the $N_2$ gas, and the cover member 36 may be mounted in the box structure 30 to cover a portion through which an internal $N_2$ gas may be leaked to the outside, so that the buffer spaces BS are formed. For example, when a door is mounted in the box structure 30 for maintenance, a detachable cover member may be mounted in the door.

While in the above embodiments, the cover member 36 has been described to have the plate shape, in some embodiments the cover member 36 may have, e.g., a box shape (a hexahedral shape whose one of six faces is opened). In some embodiments, the cover member 36 may be fabricated in conformity to a shape of a portion to be covered. Moreover, as the sealing member 36S was used in the experiment shown in FIG. 8, when a structural gap is formed between the cover member 36 and the box structure 30, a cover member including a sealing member configured to cover the structural gap in conformity to a shape thereof, may be employed.

Further, in some embodiments, additional buffer spaces having the same arrangement as the buffer spaces BS may be formed by mounting another cover member of, e.g., a box shape, in the box structure 30 so as to cover the cover member 36 shown in FIGS. 3 and 4. With this configuration, the $N_2$ gas is leaked from the buffer spaces BS into another buffer spaces, which reduces an oxygen concentration in the another buffer spaces. Therefore, an amount of oxygen which is reversely diffused from another buffer spaces into the buffer spaces BS is lower than a case where outside air is reversely diffused. This further reduces the oxygen concentration in the buffer spaces BS, which further reduces the oxygen concentration in the internal space of the box structure 30.

Moreover, in some embodiments, the first gap G1 may be formed between a plurality of columns constituting the, e.g., approximately hexahedral shaped box structure 30, and a wall panel mounted in the plurality of columns. In some embodiments, a hole or a slit, which functions as the first and second gaps G1 and G2, may be formed in the box structure 30 or the cover member.

According to the present disclosure in some embodiments, it is possible to further reduce concentration of oxygen existing in an internal space of a housing of a substrate processing apparatus.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A housing having an internal atmosphere of a reduced oxygen concentration, comprising:
a box structure having side walls, a front wall, a bottom plate, a partition wall and a ceiling plate, the box structure configured to accommodate a substrate holding unit which receives a plurality of substrates therein and including an opening section formed in one of the side walls;
a carry-in/carry-out area for carrying a wafer carrier wherein the box structure and the carry-in/carry-out area are partitioned by the partition wall and substrates are transferred between the wafer carrier and the substrate holding unit;
an inert gas pipe connected to the box structure, and configured to supply an inert gas to the box structure;
a plurality of mounting surfaces formed on the one of the side walls of the box structure by bending the one of the side walls toward the center of the opening section by a predetermined number, the mounting surfaces being formed parallel to the one of the side walls and at an inner position than the one of the side walls, and some of the plurality of mounting surfaces defining an outer edge of the opening section of the one of the side walls;
a concave portion defined by the plurality of mounting surfaces and formed in the vicinity of an outer edge of the opening section of the one of the side walls; and
a cover member configured to bring into contact with the plurality of mounting surfaces to cover the opening section while maintaining a predetermined gas-tightness for gas in an internal space of the box structure to flow through contact portions, the concave portion having one opening toward the cover member,
wherein a buffer space is formed at a space between the concave portion and the cover member when the one opening of the concave portion and the plurality of mounting surfaces are covered with the cover member,
wherein the gas in the internal space and the buffer space is leaked through the contact portions,
wherein the internal space is kept in a positive pressure by the inert gas supplied thereto through the inert gas pipe,
wherein a stepped space is formed between the side wall and the plurality of mounting surfaces, and
wherein the cover member is a casing of a filter through which the inert gas supplied into the internal space flows, and is located in the stepped space.

2. The housing of claim 1, wherein the plurality of mounting surfaces is formed in plane with each other with the buffer space interposed therebetween.

3. The housing of claim 1, further comprising:
an exhaust unit connected to an exhaust pipe which is configured to exhaust the inert gas supplied to the box structure; and
a pressure adjusting unit mounted in the exhaust pipe, and configured to adjust a supply amount of the inert gas and the pressure in the internal space.

4. The housing of claim 1, wherein the cover member is mounted in the box structure by a screw or an adhesive tape.

5. The housing of claim 1, wherein an oxygen concentration in the buffer space is equal to or less than 600 ppm.

6. A substrate processing apparatus having an internal atmosphere of a reduced oxygen concentration, comprising:
a housing of claim 1;
a reaction tube configured to receive a substrate holder; and
a process gas supply unit configured to supply a predetermined process gas into the reaction tube.

7. The substrate processing apparatus of claim 6, wherein the substrate includes a titanium film,
wherein the process gas supply unit includes:
a first process gas supply pipe through which a silicon-containing process gas is supplied; and
a second process gas supply pipe through which a nitriding gas is supplied.

* * * * *